(12) United States Patent
Goto

(10) Patent No.: US 9,678,167 B2
(45) Date of Patent: Jun. 13, 2017

(54) DEGRADATION SPEED ESTIMATION METHOD, AND DEGRADATION SPEED ESTIMATION DEVICE, OF LITHIUM-ION BATTERY

(75) Inventor: Satoshi Goto, Toyota (JP)

(73) Assignee: Toyota Jidosha Kabushiki Kaisha, Toyota-shi, Aichi (JP)

(*) Notice: Subject to any disclaimer, the term of this patent is extended or adjusted under 35 U.S.C. 154(b) by 693 days.

(21) Appl. No.: 13/993,427

(22) PCT Filed: Jan. 14, 2011

(86) PCT No.: PCT/JP2011/000177
§ 371 (c)(1),
(2), (4) Date: Jun. 12, 2013

(87) PCT Pub. No.: WO2012/095894
PCT Pub. Date: Jul. 19, 2012

(65) Prior Publication Data
US 2013/0282316 A1    Oct. 24, 2013

(51) Int. Cl.
*G01R 31/36* (2006.01)
*H01M 10/48* (2006.01)
*H01M 10/0525* (2010.01)
*H01M 10/42* (2006.01)
*H01M 4/587* (2010.01)

(52) U.S. Cl.
CPC ........ *G01R 31/3679* (2013.01); *H01M 10/48* (2013.01); *H01M 10/486* (2013.01); *H01M 4/587* (2013.01); *H01M 10/0525* (2013.01); *H01M 2010/4271* (2013.01)

(58) Field of Classification Search
CPC ........... G01R 31/3679; H01M 10/486; H01M 1/0525; Y02T 10/7011
USPC ............................................. 320/132; 702/63
See application file for complete search history.

(56) References Cited

U.S. PATENT DOCUMENTS

| 7,091,698 B2* | 8/2006 | Yamazaki | G01R 31/3679 320/132 |
| 2005/0001625 A1* | 1/2005 | Ashtiani | H01M 10/48 324/426 |
| 2010/0052617 A1 | 3/2010 | Aridome et al. | |
| 2011/0112782 A1* | 5/2011 | Majima | G01R 31/361 702/63 |

FOREIGN PATENT DOCUMENTS

| JP | 2002-340997 | * 11/2002 | ............. G01R 31/36 |
| JP | 2010-60408 | 3/2010 | |

* cited by examiner

*Primary Examiner* — Mohamed Charioui
*Assistant Examiner* — Catherine Rastovski
(74) *Attorney, Agent, or Firm* — Finnegan, Henderson, Farabow, Garrett & Dunner, LLP

(57) ABSTRACT

A deterioration rate estimation method for a lithium-ion battery of estimating the deterioration rate of the lithium-ion battery including a negative electrode having stage structures switching depending on an electric storage amount includes a first step of acquiring first information about the stage structure, a second step of acquiring second information about the battery temperature of the lithium-ion battery, and a third step of estimating the deterioration rate from the first information and the second information.

10 Claims, 6 Drawing Sheets

FIG.3

| BATTERY VOLTAGE RANGE 1 | |
|---|---|
| TEMPE-RATURE | DETERIO-RATION RATE |
| 10~15°C | V11 |
| 15~20°C | V12 |
| 20~25°C | V13 |
| ⋮ | ⋮ |
| 60~65°C | V1n |

| BATTERY VOLTAGE RANGE 2 | |
|---|---|
| TEMPE-RATURE | DETERIO-RATION RATE |
| 10~15°C | V21 |
| 15~20°C | V22 |
| 20~25°C | V23 |
| ⋮ | ⋮ |
| 60~65°C | V2n |

| BATTERY VOLTAGE RANGE 3 | |
|---|---|
| TEMPE-RATURE | DETERIO-RATION RATE |
| 10~15°C | V31 |
| 15~20°C | V32 |
| 20~25°C | V33 |
| ⋮ | ⋮ |
| 60~65°C | V3n |

DEGRADATION SPEED ESTIMATION METHOD, AND DEGRADATION SPEED ESTIMATION DEVICE, OF LITHIUM-ION BATTERY

CROSS-REFERENCE TO RELATED APPLICATIONS

This application is a national phase application of International Application No. PCT/JP2011/000177, filed Jan. 14, 2011, the content of which is incorporated herein by reference.

TECHNICAL FIELD

The present invention relates to an estimation method for estimating the deterioration rate of a lithium-ion battery, and the like.

BACKGROUND ART

An electric storage apparatus formed of a lithium-ion battery is known as a driving or auxiliary power source for an electric car, a hybrid car and the like. The lithium-ion battery experiences a reduced battery capacity and thus suffers deterioration due to repeated charge and discharge. Since the deterioration rate of the lithium-ion battery follows the Arrhenius law, the deterioration rate is increased as the temperature rises.

Patent Document 1 (Japanese Patent Laid-Open No. 2010-060408) has disclosed a method of determining the deterioration of a lithium-ion battery in which the deterioration state of the lithium-ion battery is determined on the basis of information about changes in voltage of the lithium-ion battery obtained in a diagnostic mode wherein the lithium-ion battery is successively discharged and charged at a fixed power value.

PRIOR ART DOCUMENTS

Patent Documents

[Patent Document 1] Japanese Patent Laid-Open No. 2010-060408

DISCLOSURE OF THE INVENTION

Problems to be Solved by the Invention

The deterioration rate, however, cannot be determined accurately only from the temperature information of the lithium-ion battery. To address this, it is an object of the present invention to estimate the deterioration rate of the lithium-ion battery more accurately.

Means for Solving the Problems

To solve the abovementioned problem, according to an aspect, the present invention provides (1) a deterioration rate estimation method for a lithium-ion battery of estimating the deterioration rate of the lithium-ion battery including a negative electrode having stage structures switching depending on an electric storage amount, including a first step of acquiring first information about the battery voltage of the lithium-ion battery, a second step of acquiring second information about the battery temperature of the lithium-ion battery, and a third step of estimating the deterioration rate from the first information and the second information based on third information about a correspondence between a voltage range of the lithium-ion battery, the battery temperature, and the deterioration rate for each of the stage structures.

(3) In the configuration described in (1), the method includes a fourth step of calculating the deterioration amount from the deterioration rate estimated at the third step, a fifth step of sequentially accumulating the deterioration amount obtained at the fourth step until an evaluation parameter for evaluating the deterioration amount of the lithium-ion battery exceeds a limit value, and a sixth step of correcting the voltage range in the third information based on the accumulated deterioration amount obtained at the fifth step. Since the relationship between the battery voltage and the stage structure of the negative electrode is changed when the lithium-ion battery is deteriorated, the third information can be corrected on the basis of the accumulated deterioration amount to increase the accuracy in estimating the deterioration rate.

(4) In the configuration described in (3), the deterioration rate may be successively calculated within a predefined set time at the third step, and the deterioration amount may be calculated by multiplying the set time by the average rate of the deterioration rates at the fourth step.

(5) In the configuration described in (1), the negative electrode may be based on graphite. Since the graphite-based negative electrode exhibits apparent changes in the stage structure, the third information can be obtained easily.

(6) To solve the abovementioned problem, according to another aspect, the present invention provides (6) a deterioration rate estimation apparatus for a lithium-ion battery of estimating the deterioration rate of the lithium-ion battery including a negative electrode having stage structures switching depending on an electric storage amount, including a first acquiring section acquiring first information about the battery voltage of the lithium-ion battery, a second acquiring section acquiring second information about the battery temperature of the lithium-ion battery, a storage section storing third information about a correspondence between a voltage range of the lithium-ion battery, the battery temperature, and the deterioration rate for each of the stage structures, a controller estimating the deterioration rate from the first information and the second information based on the third information stored in the storage section.

(8) In the configuration described in (6), an accumulated deterioration amount provided by sequentially accumulating a deterioration amount calculated from the estimated deterioration rate may be stored in the storage section, and the controller may update the accumulated deterioration amount stored in the storage section until an evaluation parameter for evaluating the deterioration amount of the lithium-ion battery exceeds a limit value, and correct the range of the battery voltage in the third information based on the updated accumulated deterioration amount. Since the relationship between the battery voltage and the stage structure of the negative electrode is changed when the lithium-ion battery is deteriorated, the third information can be corrected on the basis of the accumulated deterioration amount to increase the accuracy in estimating the deterioration rate.

(9) In the configuration described in (8), the controller may successively calculate the deterioration rate within a predefined set time and calculate the deterioration amount by multiplying the set time by the average rate of the deterioration rates.

(10) In the configuration described in (6), the negative electrode may be based on graphite. Since the graphite-based negative electrode exhibits apparent changes in the stage structure, the third information can be obtained easily.

Advantage of the Invention

According to the present invention, the deterioration rate of the lithium-ion battery can be estimated more accurately.

BRIEF DESCRIPTION OF THE DRAWINGS

FIG. 3 shows data tables for deterioration rate estimation information.

BEST MODE FOR CARRYING OUT THE INVENTION

Figure 1:
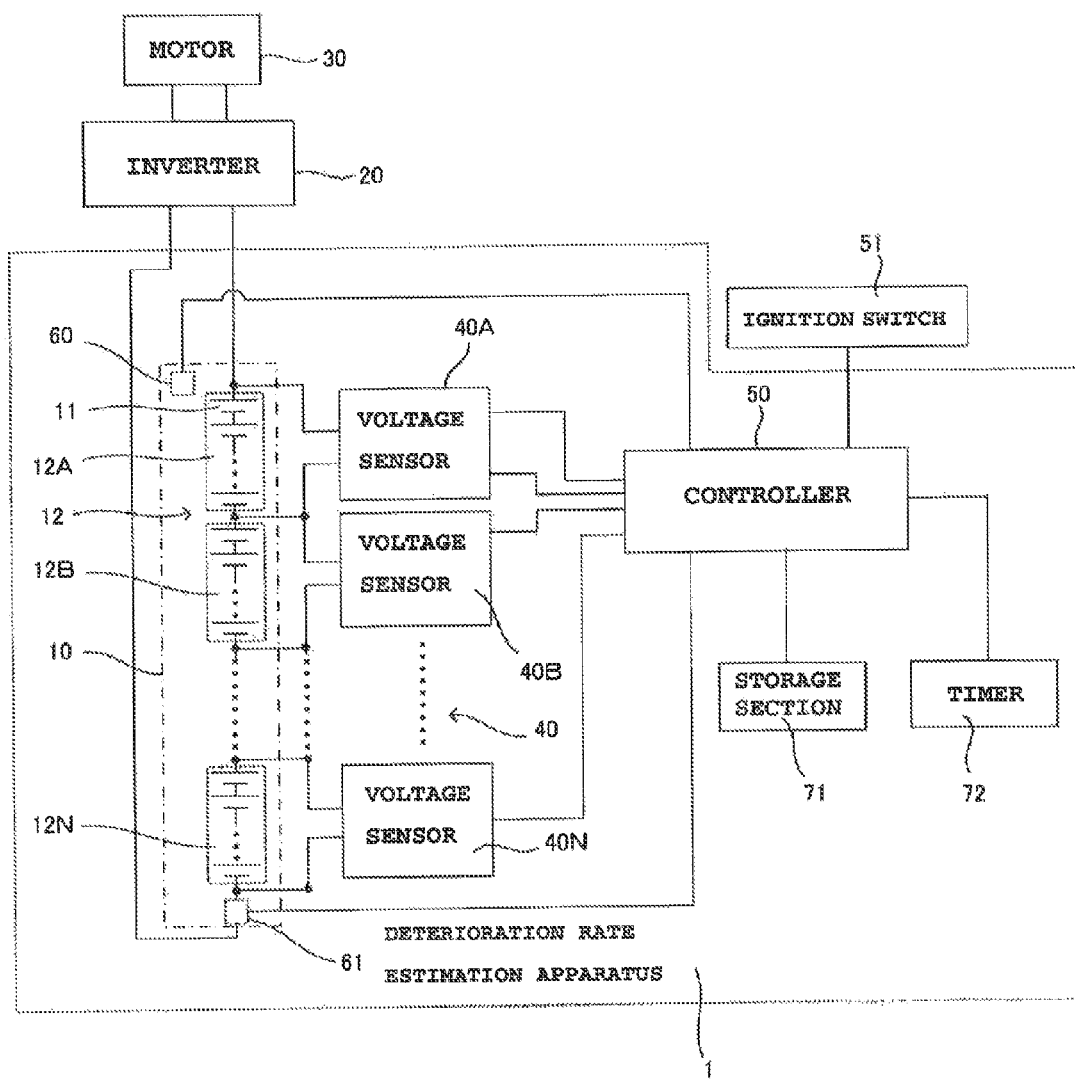
FIG. 1 is a block diagram showing a deterioration rate estimation apparatus.

FIG. 1 is a block diagram showing a deterioration rate estimation apparatus for estimating the deterioration rate of a lithium-ion battery according to the present embodiment. The deterioration rate estimation apparatus 1 includes an assembled battery 10, voltage sensors (first acquiring sections) 40A to 40N, a controller 50, a temperature sensor (second acquiring section) 60, a storage section 71, and a timer 72. The assembled battery 10 includes a plurality of battery blocks 12 which are connected electrically in series. Each of the battery blocks 12A to 12N includes a plurality of lithium-ion batteries 11 which are connected electrically in series.

An inverter 20 is connected electrically to a general positive terminal and a general negative terminal in the assembled battery 10 through wiring. The inverter 20 is connected electrically to a motor 30 and drives the motor 30 with the output from the assembled battery 10.

The assembled battery 10 according to the present embodiment is mounted on a vehicle (not shown), and the vehicle can be run by driving the motor 30. In braking of the vehicle, the assembled battery 10 can be charged with power generated by using a motor generator (not shown) serving as a generator.

Examples of the vehicle described above include a hybrid car and an electric car. The hybrid car is a vehicle which includes not only the assembled battery 10 but also another power source such as an internal-combustion engine and a fuel cell for driving of the vehicle. The electric car is a vehicle which runs only with the output from the assembled battery 10.

The controller 50 may be a CPU (Central Processing Unit) or an MPU (Micro Processing Unit). The controller 50 may include an ASIC which executes in circuitry at least part of processing performed by the CPU or the MPU.

The temperature sensor 60 is connected to the controller 50. The controller 50 monitors the temperature of the assembled battery 10 at all times based on temperature information output from the temperature sensor 60.

A current sensor 61 is connected to the wiring of the assembled battery 10. The current sensor 61 is connected to the controller 50. The voltage sensors 40A to 40N are connected to the battery blocks 12A to 12N, respectively. The voltage sensors 40A to 40N detect the voltages (hereinafter referred to as block voltages) of the associated battery blocks 12A to 12N, respectively, and output the detection results to the controller 50. The controller 50 is connected electrically to an ignition switch 51.

The storage section 71 stores an estimation program for estimating the deterioration rate of the lithium-ion battery, a correction program for correcting the estimated deterioration rate, and information (for example, the output values of the voltage sensors 40 and the temperature sensor 60) required in executing these programs. Details of the information stored in the storage section 71 are described later.

The controller 50 reads the programs stored in the storage section 71 into a memory, not shown, and interprets those programs. The storage section 71 may be a RAM (Random Access Memory), a ROM (Read Only Memory), a DRAM (Dynamic Random Access Memory), or an SRAM (Static Random Access Memory).

The present inventor has found a correlation between the stage structure of a negative electrode of the lithium-ion battery 11 and the deterioration rate. Specifically, the present inventor has found that the deterioration rate exhibits extremely small variations in the same stage structure of the negative electrode and at the same battery temperature even when the battery voltage varies.

Figure 2:
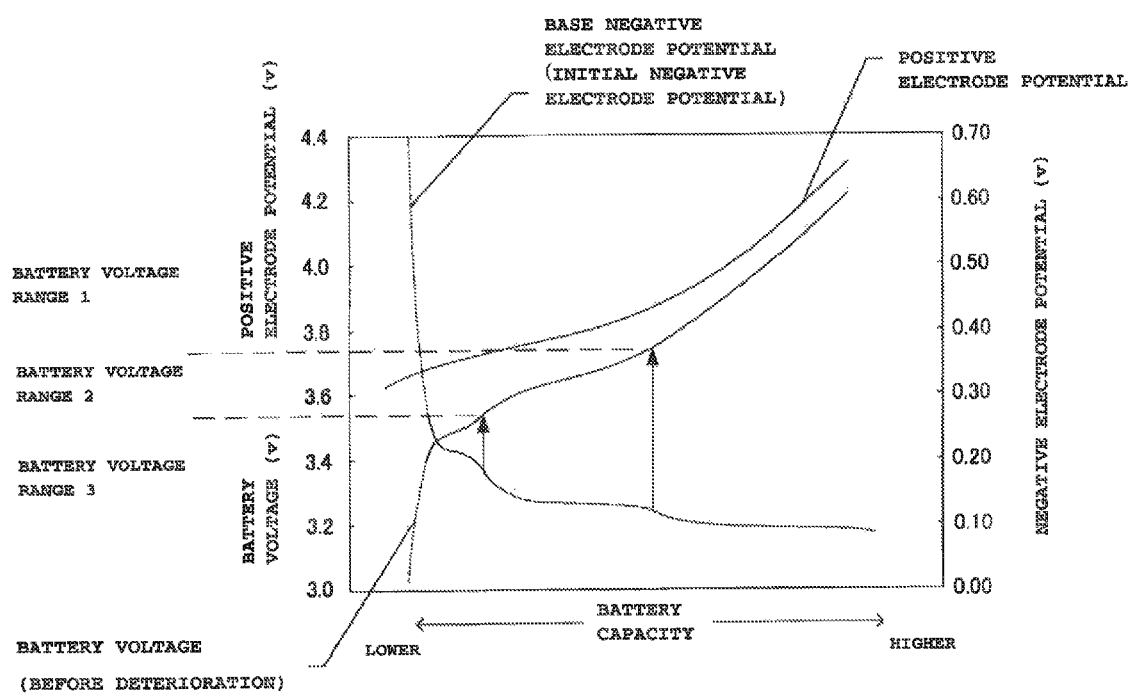
FIG. 2 shows a graph representing the relationship between a stage structure of a negative electrode and a battery voltage.

Referring to FIG. 2, the findings described above are described in more detail. FIG. 2 shows the relationship between the stage structure of the negative electrode and the battery voltage in which the lithium-ion battery 11 unused and not deteriorated is investigated. In FIG. 2, the horizontal axis represents the battery capacity of the lithium-ion battery 11 and the vertical axis represents the potential. A right scale on the vertical axis represents the potential of the negative electrode, and a left scale on the vertical axis represents the potential of a positive electrode and the battery voltage of the lithium-ion battery 11. The lithium-ion battery 11 was produced in the following method.

Lithium nickel cobalt manganese oxide serving as an active material of the positive electrode was mixed with acetylene black serving as a conductive material together with polyvinylidene fluoride (PVDF) in N-methylpyrrolidone (NMP) to prepare a composition for positive electrode in paste form. For the respective materials (except NMP) contained in the composition, the positive electrode active material constituted 87 mass %, acetylene black constituted 10 mass %, and PVDF constituted 3 mass %. The composition for positive electrode was applied to each surface of aluminum foil serving as a positive electrode collector to provide a positive electrode in sheet form (positive electrode sheet) having the layer containing the positive electrode active material on each of the surfaces of the positive electrode collector.

Next, the provided positive electrode sheet was opposed to a negative electrode sheet including graphite applied to conductive foil with a porous resin film sandwiched therebetween to provide an electrode unit. The provided electrode unit and a nonaqueous electrolytic solution were used to form a lithium-ion secondary battery. The electrolytic solution included supporting salt in a mixture solvent containing ethylene carbonate (EC), ethylmethyl carbonate (EMC), and dimethyl carbonate (DMC). The mixture ratio in the mixture solvent of ethylene carbonate (EC):ethylmethyl carbonate (EMC):dimethyl carbonate (DMC) was 3:4:3 by volume. LIPF6 was used as the supporting salt, and the concentration thereof was adjusted such that the LIPF6 was contained at a concentration of approximately 1 mol/l.

When the negative electrode based on graphite is used, lithium is occluded between graphite layers in a layered structure. The lithium occluding graphite has the stage structure in which lithium is occluded between particular ones of the layers arranged at regular intervals. For example, "stage n" means that (n–1) layers not occluding lithium are present between the layers occluding lithium. Thus, the value of n depends on the amount of occluded lithium. The stage structure can also be specified in the lithium-ion battery having the negative electrode based on a material other than graphite.

Referring to FIG. 2, arrows extending from a curve representing the negative electrode potential indicate the boundaries on which the stage structure of the negative electrode switches. At the point where the curve representing the negative electrode potential is changed sharply, the stage structure of the negative electrode switches. For this reason, the stage structure of the negative electrode can be determined by charging and discharging the lithium-ion battery 11 to obtain the changes in the negative electrode potential. In the negative electrode of the lithium-ion battery 11 according to the present embodiment, the stage structure switches from a stage 1 to a stage 2, and to a stage 3 in order of decreasing electric storage amount.

At the same temperature and in the same stage structure of the negative electrode, the lithium-ion battery 11 has the same deterioration rate (including errors). When the stage structure of the negative electrode switches, the deterioration rate of the lithium-ion battery 11 is changed. Thus, the deterioration rate of the lithium-ion battery 11 can be estimated by finding the potential range of the negative electrode potential corresponding to each of the stages 1 to 3.

The assembled battery 10 described above, however, is formed such that the block voltage is measured, and the negative electrode potential cannot be measured directly. In this case, the relationship between the negative electrode potential and the battery voltage can be obtained previously by experiment or simulation to specify the stage structure of the negative electrode from the measured battery voltage. In addition, the correspondence between the battery voltage, the battery temperature, and the deterioration rate can be obtained previously by experiment or simulation, and the obtained information (hereinafter referred to as deterioration rate estimation information (third information)) can be stored in the storage section 71 to achieve accurate estimation of the deterioration rate.

Specifically, as shown in FIG. 2, the voltage range of the battery voltage corresponding to each of the stage structures of the negative electrode is found previously, and for each of the battery voltage ranges, the deterioration rate estimation information including the associated battery temperature and deterioration rate is stored as data to allow the accurate estimation of the deterioration rate. The battery voltage ranges in the present embodiment consist of battery voltage ranges 1 to 3.

The data format of the deterioration rate estimation information may be a data table. FIG. 3 shows an example of the data table stored in the storage section 71. In the present embodiment, the deterioration rate is specified at intervals of 5° C. in each of the battery voltage ranges 1 to 3. The intervals in temperature are not limited to 5° C., and the deterioration rate may be specified, for example at intervals of 1° C.

The data format of the deterioration rate estimation information may be a function program for calculating the deterioration rate. In this case, the function program having the battery voltage and the battery temperature as variables is provided in each of the battery voltage ranges 1 to 3 and is stored in the storage section 71. The controller 50 interprets the function program to calculate the deterioration rate. Since the relationship between the deterioration rate and the battery temperature is defined by the Arrhenius law, the function program may be programmed in accordance with the Arrhenius law.

Figure 4:
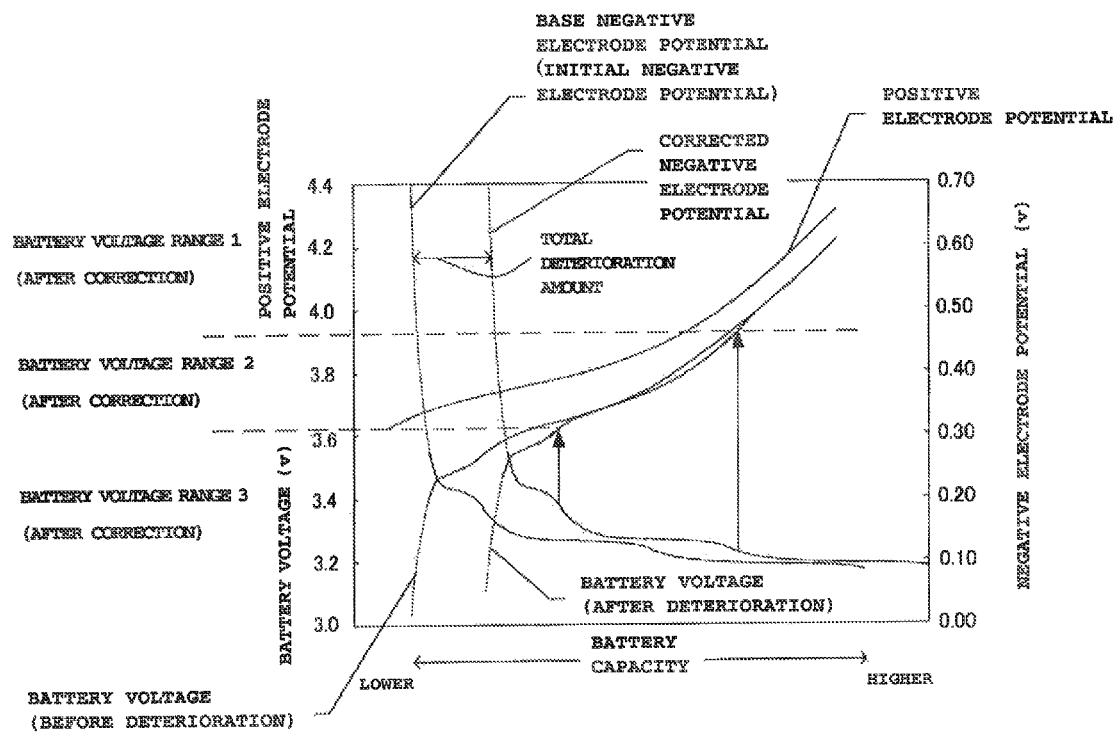
FIG. 4 shows a graph corresponding to FIG. 2 and illustrates the states of the battery before and after deterioration.

The negative electrode potential shown in FIG. 2 is shifted to the right when the battery capacity is reduced (battery is deteriorated). FIG. 4 shows a graph corresponding to FIG. 2 and illustrates the negative electrode potential shifted to the right since the battery capacity is reduced.

In FIG. 4, a curve indicated as "base negative electrode potential" represents the negative electrode potential of the lithium-ion battery 11 when it is unused, and a curve indicated as "corrected negative electrode potential" represents the negative electrode potential of the lithium-ion battery 11 after it is deteriorated. A curve indicated as "battery voltage (before deterioration)" represents the battery voltage of the lithium-ion battery 11 when it is unused, and a curve indicated as "battery voltage (after deterioration)" represents the battery voltage of the lithium-ion battery 11 after it is deteriorated.

A comparison between the curves of "base negative electrode potential" and "corrected negative electrode potential" reveals that the deterioration of the lithium-ion battery 11 causes the curve representing the negative electrode potential to be shifted to the right without changing the shape. A comparison between the curves of "battery voltage (before deterioration)" and "battery voltage (after deterioration)" reveals that the deterioration of the lithium-ion battery 11 also changes the curve representing the battery voltage. Thus, when the lithium-ion battery 11 is deteriorated, the battery voltage ranges 1 to 3 corresponding to the respective stage structures of the negative electrode can be corrected to increase the accuracy in estimating the deterioration rate.

Next, a method of correcting the battery voltage ranges 1 to 3 is described with reference to a flow chart in FIG. 5. In the flow chart, an accumulated deterioration amount refers to a cumulative value of deterioration amounts and means the total sum of deterioration amounts added up until a limit value is exceeded. A total deterioration amount refers to the total sum of the accumulated deterioration amounts. For convenience, the description begins with step S102.

At step S102, the controller 50 stores the battery temperature acquired by the temperature sensor 60 and the battery voltages acquired by the voltage sensors 40A to 40N in the storage section 71 at predetermined intervals, and starts the timer 72.

The battery voltage stored in the storage section 71 may be the total sum of the voltage values output from the voltage sensors 40A to 40N, that is, the cell voltage value calculated by dividing the voltage value of the assembled battery 10 by the number of the lithium-ion batteries 11. In the following description, the cell voltage value is referred to as the battery voltage. The predetermined interval is shorter than a design time, later described, and may be one second, by way of example. The storage section 71 has the accumulated deterioration amount and the total deterioration amount stored therein.

At step S103, the controller 50 references the data table stored in the storage section 71 to retrieve the deterioration rate based on the battery voltage and the battery temperature detected at step S102. The retrieved deterioration rate is then stored in the storage section 71.

At step S104, the controller 50 determines whether or not the count time in the timer 72 reaches the predefined set time. The set time may be one hour. When the count time reaches the set time at step S104, the controller proceeds to step S105. When the count time does not reach the set time, the controller 40 returns to step S102 to repeat the processing at steps S102 and S103 until the set time elapses.

At step S105, the controller 50 multiplies the set time by the average deterioration rate resulting from averaging the deterioration rates accumulated in the storage section 71 to calculate the deterioration amount. At step S106, the controller 50 adds the deterioration amount calculated at step S105 to the accumulated deterioration amount stored in the storage section 71 to calculate the latest accumulated deterioration amount. For an unused battery, the last accumulated deterioration amount is zero.

At step S107, the controller 50 determines whether or not the accumulated deterioration amount updated at step S106 is larger than the limit value. The limit value can be set as appropriate in view of improvement of the accuracy in estimating the battery deterioration amount. Specifically, the accuracy in estimating the deterioration rate is reduced at a higher limit value, whereas the accuracy in estimating the deterioration rate is increased at a lower limit value. The limit value may be 1%, for example.

When the updated accumulated deterioration amount is smaller than the limit value at step S107, the controller proceeds to step S101 and resets the deterioration amount (not the accumulated deterioration amount). When the updated accumulated deterioration amount is larger than the limit value at step S107, the controller proceeds to step S108.

At step S108, the controller 50 adds the accumulated deterioration amount updated at step S106 to the total deterioration amount stored in the storage section 71 to update the total deterioration amount. At step S109, the controller 50 shifts the curve representing "base negative electrode potential" to the right by the capacity corresponding to the updated total deterioration amount to provide the curve representing "corrected negative electrode potential."

The controller 50 corrects the battery voltage ranges 1 to 3 based on the curve representing "corrected negative electrode potential" and the curve representing "battery voltage (after deterioration)." Specifically, the controller 50 determines the intersections of the boundaries of the stage structures on the curve representing "corrected negative electrode potential" and the curve representing "battery voltage (after deterioration)" to correct the battery voltage ranges 1 to 3 to rewrite the data tables stored in the storage section 71.

At step S110, the controller 50 resets the accumulated deterioration amount stored in the storage section 71 and returns to step S101.

According to the method described above, the accuracy in estimating the deterioration rate can be enhanced by obtaining the information about the switches of the stage structure of the negative electrode. This enables more accurate estimation of the deterioration state of the battery.

Modification 1

Figure 5:
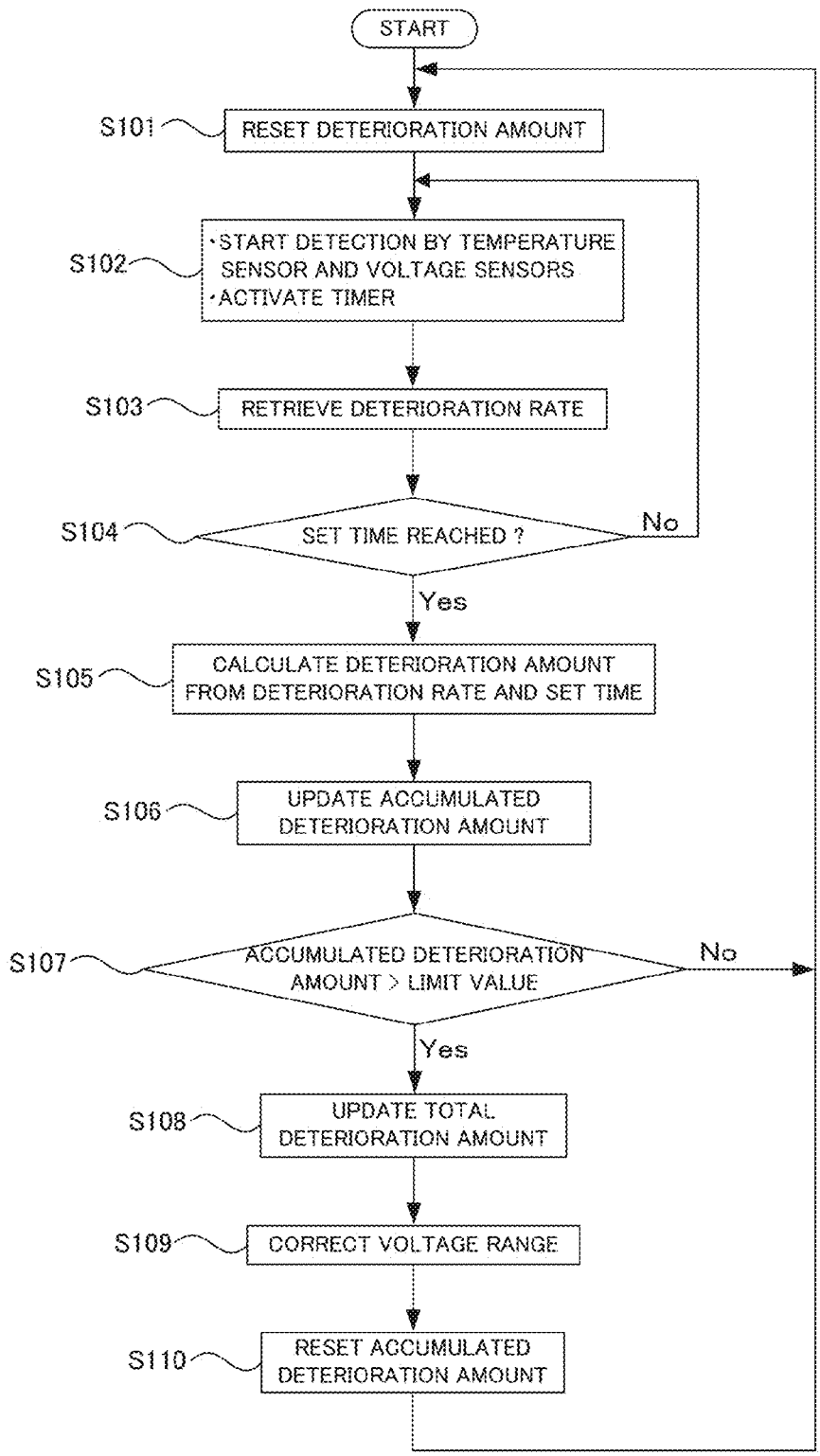
FIG. 5 is a flow chart showing an estimation method of estimating the deterioration rate.

While the flow chart in FIG. 5 includes step S107 at which the battery voltage ranges are corrected when the accumulated deterioration amount (evaluation parameter) is larger than the limit value, the present invention is not limited thereto. Another evaluation parameter capable of indirect estimation of the degree of the deterioration amount may be used.

The other evaluation parameter may be a running distance of the vehicle. In this case, the running distance of the vehicle is measured, and when the running distance reaches a predetermined distance, the battery voltage ranges are corrected. The accuracy in estimating the deterioration rate is increased as the predetermined distance is reduced, whereas the accuracy in estimating the deterioration rate is reduced as the predetermined distance is increased. Thus, the required accuracy in estimating the deterioration rate may be previously defined, and the predetermined distance may be set on the basis of that accuracy. In this case, the predetermined distance serving as the limit value is compared with the running distance of the vehicle at step S107.

Modification 2

The other evaluation parameter in Modification 1 may be replaced with the number of turn-ons of an ignition coil of the vehicle. In this case, the number of turn-ons of the ignition coil of the vehicle is sensed, and when the sensed number reaches a predetermined number, the battery voltage ranges are corrected. The accuracy in estimating the deterioration rate is increased as the predetermined number is reduced, whereas the accuracy in estimating the deterioration rate is reduced as the predetermined number is increased. Thus, the required accuracy in estimating the deterioration rate may be previously defined, and the predetermined number may be set on the basis of that accuracy. In this case, the number of turn-ons of the ignition coil is compared with the predetermined number serving as the limit value at step S107. As shown in Modifications 1 and 2, the evaluation parameter can be specified from various viewpoints and is not limited to the same parameter as the deterioration amount.

Modification 3

Figure 6:
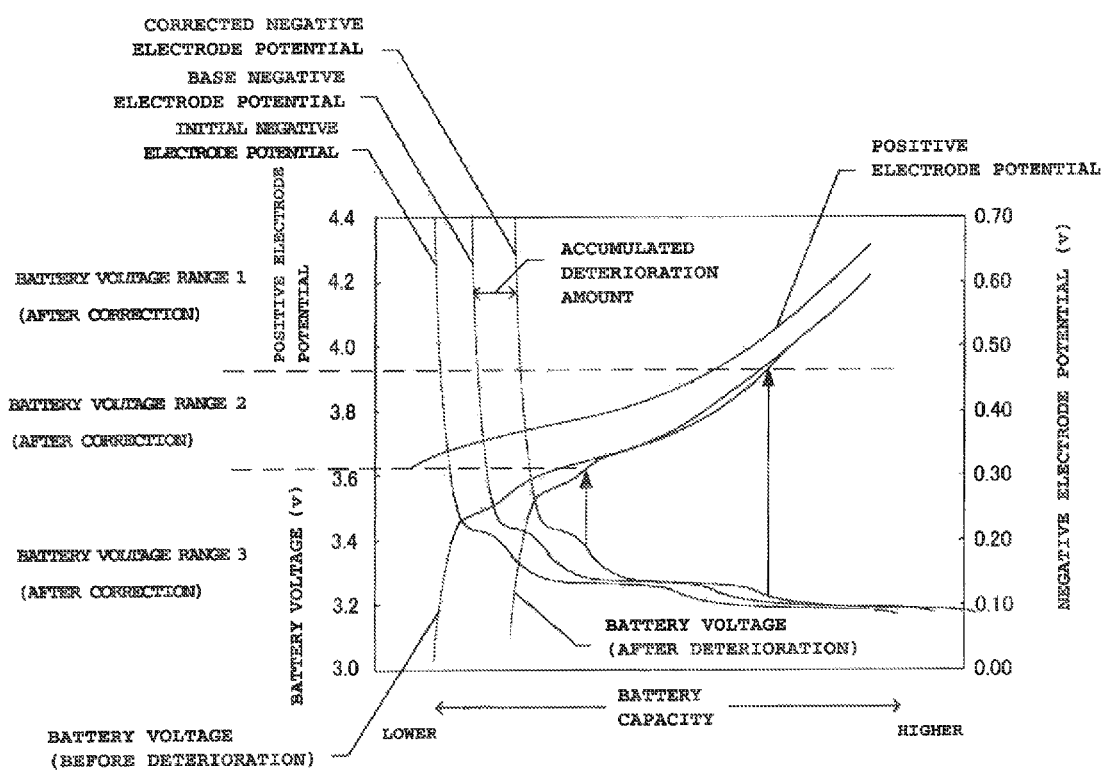
FIG. 6 shows a graph (in Modification) corresponding to FIG. 2 and illustrates the states of the battery before and after deterioration.

While the embodiment described above includes updating the total deterioration amount at step S108 in FIG. 5, the present invention is not limited thereto, and another method may be used. FIG. 6 shows a graph corresponding to FIG. 4 and illustrates the negative electrode potential shifted to the right when the battery capacity is reduced. In the embodiment described above, the curve representing the negative electrode potential is shifted by the total deterioration amount relative to the unused lithium-ion battery 11, that is, the initial negative electrode potential. In Modification 3, however, the curve representing the negative electrode potential is shifted by the accumulated deterioration amount relative to the negative electrode potential of the lithium-ion battery after deterioration.

Specifically, when the battery voltage ranges are corrected, the corrected battery voltage ranges are stored as base data (base negative electrode potential) in the storage section 71. When the battery voltage ranges are corrected the next time, the curve representing the base negative electrode potential is shifted by the accumulated deterioration amount to correct the battery voltage ranges. The embodiment described above and Modification 3 are identical in that the calculated accumulated deterioration amount is used as correction information for the battery voltage ranges but they are different in the negative electrode potential curve which is used as the reference in the correction.

Modification 4

While the flow chart in FIG. 5 includes calculating the deterioration amount when the set time is reached (step S104), the present invention is not limited thereto but may be configured such that the deterioration amount should be calculated by multiplying the deterioration rate by the count time in the timer when the battery voltage change exceeds a predetermined value.

The invention claimed is:

1. A deterioration speed estimation method for a lithium-ion battery of estimating a deterioration speed of the lithium-ion battery including a negative electrode having stage structures switching depending on a charge amount, comprising the steps of:
  detecting a battery voltage of the lithium-ion battery including the negative electrode having the stage structures that switch depending on the charge amount by receiving voltage measurements from sensors interspersed between each block of the lithium-ion battery;
  detecting a battery temperature of the lithium-ion battery including the negative electrode having the stage structures that switch depending on the charge amount;
  specifying a voltage range in which the detected battery voltage is included from a plurality of voltage ranges, the plurality of voltage ranges being divided by boundaries on which a stage structure of the stage structures of the negative electrode switches; and
  estimating the deterioration speed corresponding to the detected battery temperature in the specified voltage range a correspondence between the battery temperature and the deterioration speed for each of the plurality of voltage ranges.

2. The deterioration speed estimation method for the lithium-ion battery according to claim 1, further comprising the steps of:
  calculating a deterioration amount from the estimated deterioration speed;
  sequentially accumulating the calculated deterioration amount until an evaluation parameter for evaluating the deterioration amount of the lithium-ion battery exceeds a limit value; and
  correcting the voltage range based on the accumulated deterioration amount.

3. The deterioration speed estimation method for the lithium-ion battery according to claim 2, wherein the deterioration speed is successively calculated at predetermined intervals during a predefined set time, and the deterioration amount is calculated by multiplying the set time by an average speed of the deterioration speeds.

4. The deterioration speed estimation method for the lithium-ion battery according to claim 1, wherein the negative electrode is based on graphite.

5. The deterioration speed estimation method for the lithium-ion battery according to claim 1, wherein the stage structures include lithium occluded between layers of graphite in a layered structure.

6. A deterioration speed estimation apparatus for a lithium-ion battery of estimating a deterioration speed of the lithium-ion battery including a negative electrode having stage structures switching depending on a charge amount, comprising:
  a voltage sensor detecting a battery voltage of the lithium-ion battery that includes the negative electrode having the stage structures that switch depending on the charge amount by receiving voltage measurements from sensors interspersed between each block of the lithium-ion battery;
  a temperature sensor detecting a battery temperature of the lithium-ion battery that includes the negative electrode having the stage structures that switch depending on the charge amount;
  a memory storing a correspondence between the battery temperature and the deterioration speed for each of a plurality of voltage ranges, the plurality of voltage ranges being divided by boundaries on which a stage structure of the stage structures of the negative electrode switches; and
  a controller specifying the voltage range in which the detected battery voltage is included from the plurality of voltage ranges and estimating the deterioration speed corresponding to the detected battery temperature in the specified voltage range based on the correspondence between the battery temperature and the deterioration speed.

7. The deterioration speed estimation apparatus for the lithium-ion battery according to claim 6, wherein the controller calculates a deterioration amount from the estimated deterioration speed,
  the controller sequentially accumulates the calculated deterioration amount and stores the accumulated deterioration amount in the memory, and
  the controller updates the accumulated deterioration amount stored in the memory until an evaluation parameter for evaluating the deterioration amount of the lithium-ion battery exceeds a limit value, and corrects the voltage range based on the updated accumulated deterioration amount.

8. The deterioration speed estimation apparatus for the lithium-ion battery according to claim 7, wherein the controller successively calculates the deterioration speed at predetermined intervals during a predefined set time and calculates the deterioration amount by multiplying the set time by an average speed of the deterioration speeds.

9. The deterioration speed estimation apparatus for the lithium-ion battery according to claim 6, wherein the negative electrode is based on graphite.

10. The deterioration speed estimation apparatus for the lithium-ion battery according to claim 6, wherein the stage structures include lithium occluded between layers of graphite in a layered structure.

* * * * *